(12) United States Patent
Go et al.

(10) Patent No.: US 9,299,752 B2
(45) Date of Patent: Mar. 29, 2016

(54) ORGANIC LIGHT-EMITTING DISPLAY APPARATUS

(71) Applicant: Samsung Display Co., Ltd., Yongin, Gyeonggi-do (KR)

(72) Inventors: Jae-Kyung Go, Yongin (KR); So-Ra Kwon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/495,560

(22) Filed: Sep. 24, 2014

(65) Prior Publication Data

US 2015/0221708 A1 Aug. 6, 2015

(30) Foreign Application Priority Data

Feb. 5, 2014 (KR) .................. 10-2014-0013315

(51) Int. Cl.
| | |
|---|---|
| *H01L 23/52* | (2006.01) |
| *H01L 29/04* | (2006.01) |
| *H01L 27/15* | (2006.01) |
| *H01L 29/788* | (2006.01) |
| *H01L 27/32* | (2006.01) |
| *H01L 51/52* | (2006.01) |

(52) U.S. Cl.
CPC .......... *H01L 27/3246* (2013.01); *H01L 51/524* (2013.01); *H01L 51/5206* (2013.01); *H01L 51/5221* (2013.01)

(58) Field of Classification Search
CPC .............. H01L 27/322; H01L 27/3246; H01L 51/5246; H01L 27/12; H01L 51/525; H01L 51/5253; H01L 51/50; H01L 51/524; H01L 51/5206; H01L 51/5221

USPC .................. 257/99, 211, 59, 98, 316, 29, 79; 349/190, 43; 438/129; 345/45, 211

See application file for complete search history.

(56) References Cited

U.S. PATENT DOCUMENTS

| | | | |
|---|---|---|---|
| 7,019,718 B2 | 3/2006 | Yamazaki et al. | |
| 2002/0030769 A1 | 3/2002 | Bae | |
| 2004/0222429 A1* | 11/2004 | Yamazaki | ........... H01L 21/3226 257/79 |
| 2005/0024581 A1 | 2/2005 | Kim et al. | |

(Continued)

FOREIGN PATENT DOCUMENTS

| | | |
|---|---|---|
| JP | 2002-110343 A | 4/2002 |
| JP | 2002-324662 A | 11/2002 |

(Continued)

*Primary Examiner* — Long K Tran
*Assistant Examiner* — Dzung Tran
(74) *Attorney, Agent, or Firm* — Lewis Roca Rothgerber Christie LLP

(57) ABSTRACT

An organic light-emitting display apparatus includes: a substrate having a display area and a peripheral area surrounding the display area; a first insulation layer, which is located on the substrate across the display area and the peripheral area and comprises a first opening (e.g., a first groove or first hole) at the peripheral area; and a first conductive layer, which is located on the first insulation layer and has one end portion located in the first opening, wherein a distance between the top surface of the substrate and the top surface of the one end portion of the first conductive layer is smaller than or equal to a distance between the top surface of the substrate and the top surface of the first insulation layer, the portion of the one end portion of the first conductive layer being a portion of the first conductive layer toward an edge of the substrate.

18 Claims, 11 Drawing Sheets

(56) References Cited

U.S. PATENT DOCUMENTS

| | | |
|---|---|---|
| 2005/0184927 A1 | 8/2005 | Kwak |
| 2008/0024402 A1* | 1/2008 | Nishikawa ............. H05B 33/22 345/82 |
| 2008/0173871 A1* | 7/2008 | Noda .................. H01L 27/1214 257/59 |
| 2010/0207925 A1 | 8/2010 | Nakanishi |
| 2011/0063559 A1* | 3/2011 | Go .................... G02F 1/134363 349/143 |
| 2011/0095299 A1* | 4/2011 | Tsuji ................... H01L 27/3258 257/72 |
| 2012/0267676 A1 | 10/2012 | Satake |

FOREIGN PATENT DOCUMENTS

| | | |
|---|---|---|
| JP | 2005-326885 A | 11/2005 |
| KR | 2001-0105058 A | 11/2001 |
| KR | 2003-0058772 A | 7/2003 |
| KR | 10-2005-0082260 A | 8/2005 |

* cited by examiner

ORGANIC LIGHT-EMITTING DISPLAY APPARATUS

CROSS-REFERENCE TO RELATED APPLICATION

This application claims priority to and the benefit of Korean Patent Application No. 10-2014-0013315, filed on Feb. 5, 2014, in the Korean Intellectual Property Office, the disclosure of which is incorporated herein in its entirety by reference.

BACKGROUND

1. Field

One or more embodiments of the present invention relate to an organic light-emitting display apparatus.

2. Description of the Related Art

Generally, an organic light-emitting display apparatus includes a plurality of organic light-emitting devices, each of which includes a pixel electrode, a counter electrode, and an intermediate layer that is interposed between the pixel electrode and the counter electrode. The intermediate layer includes an emission layer. In such an organic light-emitting display apparatus, the pixel electrodes are arranged apart from one another, whereas the counter electrode is formed as a single body with respect to the plurality of organic light-emitting devices. Furthermore, the counter electrode contacts an electrode power supply line outside a display area and receives a preset electric signal.

However, in the manufacturing process of such a related art organic light-emitting display apparatus, after the electrode power supply line has been formed, and when a material for forming an insulation layer (e.g., a pixel defining layer) is applied thereon to form the insulation layer, the material for forming the insulation layer may not be smoothly applied due to the electrode power supply line underneath.

SUMMARY

Aspects according to one or more embodiments of the present invention are directed toward an organic light-emitting display apparatus having a structure capable of reducing defects during the formation of an insulation layer (e.g., a pixel defining layer).

Additional aspects will be set forth in part in the description which follows and, in part, will be apparent from the description, or may be learned by practice of the presented embodiments.

According to one or more embodiments of the present invention, an organic light-emitting display apparatus includes a substrate having a display area and a peripheral area surrounding the display area; a first insulation layer on the substrate and over the display area and the peripheral area, the first insulation layer including a first opening (e.g., a first groove or first hole) at the peripheral area; and a first conductive layer on the first insulation layer and having one end portion in the first opening, wherein a distance between a top surface of the substrate and a top surface of the one end portion of the first conductive layer is smaller than or equal to a distance between the top surface of the substrate and a top surface of the first insulation layer, the one end portion of the first conductive layer being a portion of the first conductive layer toward an edge of the substrate.

The first conductive layer may have a multi-layer structure, and an etch rate of a material constituting a layer below a topmost layer may be higher than an etch rate of a material constituting the topmost layer.

The first conductive layer may include a first Ti layer, an Al layer on the first Ti layer, and a second Ti layer on the Al layer.

The distance between the top surface of the substrate and the top surface of the one end portion of the first conductive layer may be identical to the distance between the top surface of the substrate and the top surface of the first insulation layer.

The top surface of the one end portion of the conductive layer and the top surface of the first insulation layer may form a continuous surface. In this case, a thickness of the first conductive layer may be identical to a thickness of the first insulation layer.

The organic light-emitting display apparatus may further include a second insulation layer between the substrate and the first insulation layer and over the display area and the peripheral area, the second insulation layer having a second opening (e.g., a second groove or second hole) corresponding to the first opening, wherein the one end portion of the first insulation layer may be in the first opening of the first insulation layer and the second opening of the second insulation layer, and the distance between the top surface of the substrate and the top surface of the one end portion of the first conductive layer may be smaller than or equal to the distance between the top surface of the substrate and the top surface of the first insulation layer. In this case, a sum of a thickness of the first insulation layer and a thickness of the second insulation layer may be greater than a thickness of the first conductive layer.

The organic light-emitting display apparatus may further include a stopper layer between the substrate and the first insulation layer and at least partially exposed by the first opening of the first insulation layer, wherein the one end portion of the first insulation layer may contact the stopper layer. Here, the stopper layer may be a second conductive layer.

The first opening of the first insulation layer may have a shape extending along an edge side of the substrate, and the first insulation layer may have a shape extending along the edge side of the substrate. The substrate may have a rectangular shape having long sides and short sides, and the edge side of the substrate may be the long side.

The first insulation layer may include a plurality of first openings formed at a plurality of locations along an edge side of the substrate, and the first insulation layer may have a shape extending along the edge side of the substrate. Here, the substrate may have a rectangular shape having long sides and short sides, and the edge side of the substrate may be the long side.

When one end portion of the first opening of the first insulation layer toward an edge of the substrate is referred to as a first portion, one end portion of the first opening of the first insulation layer toward the display area of the substrate is referred to as a second portion, and a portion between the first portion and the second portion is referred to as a third portion, a width of the first portion in a direction in which the edge side of the substrate extends may be greater than a width of the third portion in the direction in which the edge side of the substrate extends. Furthermore, the width of the third portion in the direction in which the edge of the substrate extends may be greater than a width of the second portion in the direction in which the edge side of the substrate extends.

The first insulation layer may include a third opening (e.g., a third groove or third hole) between the first opening and the edge of the substrate, an orthogonal projection image of the third opening with respect to the substrate may have a polygonal shape, and an end of the orthogonal projection image of the third opening in a direction toward the display area may be acute. In this case, the organic light-emitting display apparatus may further include a counter substrate facing the substrate, wherein the first insulation layer and the first conductive layer may be located between the counter substrate and the substrate; and a sealing unit to adhere the substrate to the counter substrate, wherein the sealing unit may fill the third opening.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
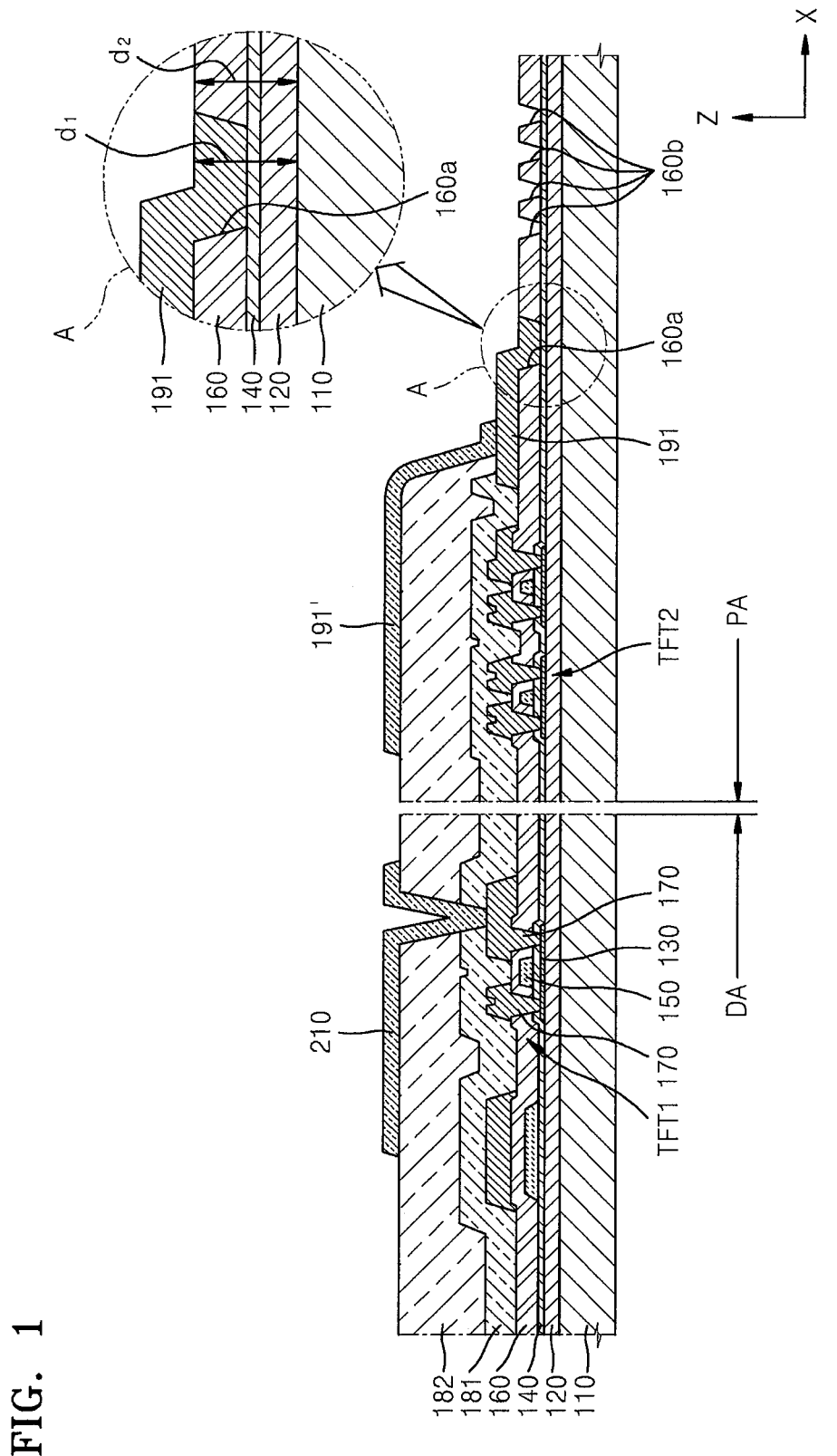
FIG. 1 is a schematic sectional view of a portion of an organic light-emitting display apparatus according to an embodiment of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Further, the use of "may" when describing embodiments of the present invention refers to "one or more embodiments of the present invention."

It will be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto. Further, when a first element is described as being "coupled" or "connected" to a second element, the first element can be directly coupled or connected to the second element; or the first element can be indirectly coupled or connected to the second element with one or more intervening elements interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic sectional view of a portion of an organic light-emitting display apparatus according to an embodiment of the present invention.

The organic light-emitting display apparatus according to an embodiment of the present invention includes a substrate 110 including a display area DA and a peripheral area PA, which is a non-display area outside the display area DA. The substrate 110 may be formed of any of various suitable materials, such as a glass material, a metal, or a plastic material. A plurality of thin-film transistors TFT1 are arranged at the display area DA of the substrate 110, where organic light-emitting devices (200, refer to FIG. 10) electrically coupled (e.g., connected) to the plurality of thin-film transistors TFT1 may be arranged. The electric coupling or connection of the organic light-emitting devices 200 to the plurality of thin-film transistors TFT1 may be understood as the electric coupling or connection of a plurality of pixel electrodes 210 to the plurality of thin-film transistors TFT1. If desired, a thin-film transistor TFT2 may be arranged at the peripheral area PA of the substrate 110. The thin-film transistor TFT2 may be a part of a circuit unit for controlling electric signals applied into the display area DA.

The thin-film transistor TFT1 or the thin-film transistor TFT2 may include a semiconductor layer 130 including an amorphous silicon, a polycrystalline silicon, or an organic semiconductor material; a gate electrode 150; and source electrode/drain electrode 170. A buffer layer 120, which is formed of silicon oxide or silicon nitride for planarizing the top surface of the substrate 110, and/or for reducing or preventing permeation of impurities into the semiconductor layer 130, is located on the substrate 110. The semiconductor layer 130 may be located on the buffer layer 120.

The gate electrode 150 is located on the semiconductor layer 130, where the source electrode 170 and the drain electrode 170 electrically communicate with each other according to a signal applied to the gate electrode 150. In consideration of adhesiveness with respect to an adjacent layer; of a surface planarity of a surface on which the gate electrode 150 is stacked; and of the processability, the gate electrode 150 may be formed as a single layer or multiple layers containing one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). Here, to secure insulation between the semiconductor layer 130 and the gate electrode 150, a gate insulation layer 140 formed of silicon oxide and/or silicon nitride may be interposed between the semiconductor layer 130 and the gate electrode 150.

An interlayer insulation layer 160 may be located on the gate electrode 150, where the interlayer insulation layer 160 may be formed as a single layer or multiple layers containing silicon oxide or silicon nitride.

The source electrode/drain electrode 170 are arranged on the interlayer insulation layer 160. The source electrode/drain electrode 170 are electrically coupled to the semiconductor layer 130 via contact holes respectively formed in the interlayer insulation layer 160 and the gate insulation layer 140. In consideration of the conductivity, the source electrode/drain electrode 170 may be formed as a single layer or multiple layers containing one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

To protect the thin-film transistor TFT1 having the structure as described above, a protection layer 181 may be arranged to cover the thin-film transistor TFT1. The protection layer 181 may be formed of an inorganic material, such as silicon oxide, silicon nitride, or silicon oxynitride. Although FIG. 1 shows that the protection layer 181 has a single layer structure, various modifications may be made therein. For example, the protection layer 181 may have a multi-layer structure.

A planarizing layer 182 may be located on the protection layer 181, if desired. For example, if the organic light-emitting device 200 is located on the thin-film transistor TFT1 as shown in FIG. 1, the planarizing layer 182 may have a flat top surface, such that the pixel electrode 210 is formed flat. The planarizing layer 182 may be formed of, for example, an acryl-based organic material or benzocyclobutene (BCB). Although FIG. 1 shows that the planarizing layer 182 has a single layer structure, various suitable modifications may be made therein. For example, the planarizing layer 182 may have a multi-layer structure.

If desired, the protection layer 181 may be omitted, the planarizing layer 182 may be omitted, or the protection layer 181 and the planarizing layer 182 may be integrated as a single body (e.g., a single layer).

In the display area DA of the substrate 110, the organic light-emitting device 200, which includes the pixel electrode 210, a counter electrode (230, refer to FIG. 10), and an intermediate layer (220, refer to FIG. 10) that is interposed between the pixel electrode 210 and the counter electrode 230 and includes an emission layer, is located on the planarizing layer 182. In FIG. 1, only the pixel electrode 210 is shown for convenience of explanation.

An opening for exposing at least one of the source electrode/drain electrodes 170 of the thin-film transistor TFT1 is respectively formed in the protection layer 181 and the planarizing layer 182. The pixel electrode 210, which is electrically coupled to the thin-film transistor TFT1 by contacting one from between the source electrode/drain electrode 170 via the openings, is located on the planarizing layer 182. The pixel electrode 210 may be formed as a transparent electrode, a semi-transparent electrode, or a reflective electrode. If the pixel electrode 210 is formed as a transparent electrode or a semi-transparent electrode, the pixel electrode 210 may be formed of, for example, ITO, IZO, ZnO, $In_2O_3$, IGO, or AZO. If the pixel electrode 210 is formed as a reflective electrode, the pixel electrode 210 may have a reflective layer formed of Ag, Mg, Al, Pt, Pd, Au, Ni, Nd, Ir, Cr, or a compound thereof; and a layer (i.e., another layer) formed of ITO, IZO, ZnO, $In_2O_3$, IGO, or AZO. However, the present invention is not limited thereto, and the pixel electrode 210 may be formed of any of various other suitable materials, and may be formed as a single layer or multiple layers.

The intermediate layer 220 of the organic light-emitting device 200 may contain a monomer material (or a low molecular weight material) or a polymer material. If the intermediate layer 220 contains a monomer material, the intermediate layer 220 may include a hole injection layer (HIL), a hole transport layer (HTL), an emission layer (EML), an electron transport layer (ETL), and an electron injection layer (EIL). If the intermediate layer 220 contains a polymer material, the intermediate layer 220 may generally have a structure including an HTL and an EML. However, the present invention is not limited thereto, and the intermediate layer 220 may have any of various other suitable structures.

The counter electrode 230 may be formed on the display area DA to cover the display area DA. In other words, the counter electrode 230 may be formed as a single body with respect to the plurality of organic light-emitting devices 200, and may correspond to the plurality of pixel electrodes 210. The counter electrode 230 may be located across (or over) the display area DA and the peripheral area PA of the substrate 110. The counter electrode 230 may be formed as a transparent electrode, a semi-transparent electrode, or a reflective electrode. If the counter electrode 230 is formed as a transparent electrode or a semi-transparent electrode, the counter electrode 230 may include a layer formed of a metal with a small work function, e.g., Li, Ca, LiF/Ca, LiF/Al, Al, Ag, Mg, or a compound thereof; and a conductive layer or a semi-conductive layer formed of ITO, IZO, ZnO, or $In_2O_3$. If the counter electrode 230 is formed as a reflective electrode, the counter electrode 230 may include a layer formed of Li, Ca, LiF/Ca, LiF/Al, Al, Ag, Mg, or a compound thereof. However, the present invention is not limited thereto, and various modifications may be made in materials and structures of the counter electrode 230.

Meanwhile, an electrode power supply line 191 and a connection line 191' contacting the electrode power supply line 191 are arranged in the peripheral area PA outside the display area DA of the substrate 110. The counter electrode 230 is located across (or over) the display area DA and the peripheral area PA of the substrate 110, and contacts the electrode power supply line 191 and/or the connection line 191' of the peripheral area PA (see FIG. 10). As a result, the counter electrode 230 may receive an electrode power, that is, an electric signal from the electrode power supply line 191.

The electrode power supply line 191 may be located in the peripheral area PA of the substrate 110 at a location that is close to the display area DA of the substrate 110. As shown in FIG. 1, the electrode power supply line 191 may be concurrently (e.g., simultaneously) formed of the same material as the thin-film transistors (e.g., the same material as the source electrodes/drain electrodes 170 of the thin-film transistor TFT1 and the thin-film transistor TFT2). Therefore, like the source electrode/drain electrode 170, the electrode power supply line 191 may be located on the interlayer insulation layer 160.

The interlayer insulation layer 160 is located across (or over) the display area DA and the peripheral area PA of the substrate 110 as shown in FIG. 1, where the interlayer insulation layer 160 includes a first opening (e.g., a first groove or first hole) 160a in the peripheral area PA. Furthermore, the electrode power supply line 191 is located on the interlayer insulation layer 160, where one end portion of the electrode power supply line 191 is located in the first opening 160a of the interlayer insulation layer 160. Here, the one end portion of the electrode power supply line 191 may be understood as the one end portion of the electrode power supply line 191 in a direction toward an edge of the substrate 110, i.e., a direction (+x direction) opposite to the direction toward the display area DA. Therefore, as shown in the portion A of FIG. 1, a distance d1 between the top surface of the substrate 110 and the top surface of the one end portion (e.g., a region of the one end portion) of the electrode power supply line 191, which is the portion of the electrode power supply line 191 located toward an edge of the substrate (+x direction), may be smaller than or equal to a distance d2 between the top surface of the substrate 110 and the top surface of the interlayer insulation layer 160.

FIG. 1 shows that the distance d1 is identical to the distance d2, and the one end portion of the electrode power supply line 191 and the interlayer insulation layer 160 form a continuous surface. For example, if the thickness of the electrode power supply line 191 is identical to that of the interlayer insulation layer 160, and the first opening 160*a* of the interlayer insulation layer 160 is a through hole as shown in FIG. 1, the distance d1 becomes identical to the distance d2, and thus the top surface of the one end portion of the electrode power supply line 191 and the top surface of the interlayer insulation layer 160 form a continuous surface.

As described above, as the distance d1 between the top surface of the substrate 110 and the top surface of the one end portion of the electrode power supply line 191, the portion of the electrode power supply line 191 toward an edge of the substrate 110 (+x direction), becomes smaller than or equal to the distance d2 between the top surface of the substrate 110 and the top surface of the interlayer insulation layer 160, an end side surface (e.g., a side surface or end facing away from the display area DA) of the one end portion of the electrode power supply line 191 may not be exposed to the outside or may have a reduced exposure (e.g., to be exposed to the minimum).

As described above, the electrode power supply line 191 may be concurrently (e.g., simultaneously) formed of the same material as the source electrode/drain electrode 170 of the thin-film transistors TFT1 and TFT2, where the electrode power supply line 191 may have a multi-layer structure and the etch rate of the material constituting the topmost layer may be smaller than the etch rate of the material constituting a layer therebelow. Therefore, the corresponding layer (below the topmost layer) may be damaged during the formation of the electrode power supply line 191 or an operation thereafter. However, in an organic light-emitting display apparatus according to the present embodiment, such damage to a layer may be effectively prevented or reduced.

Figure 2:
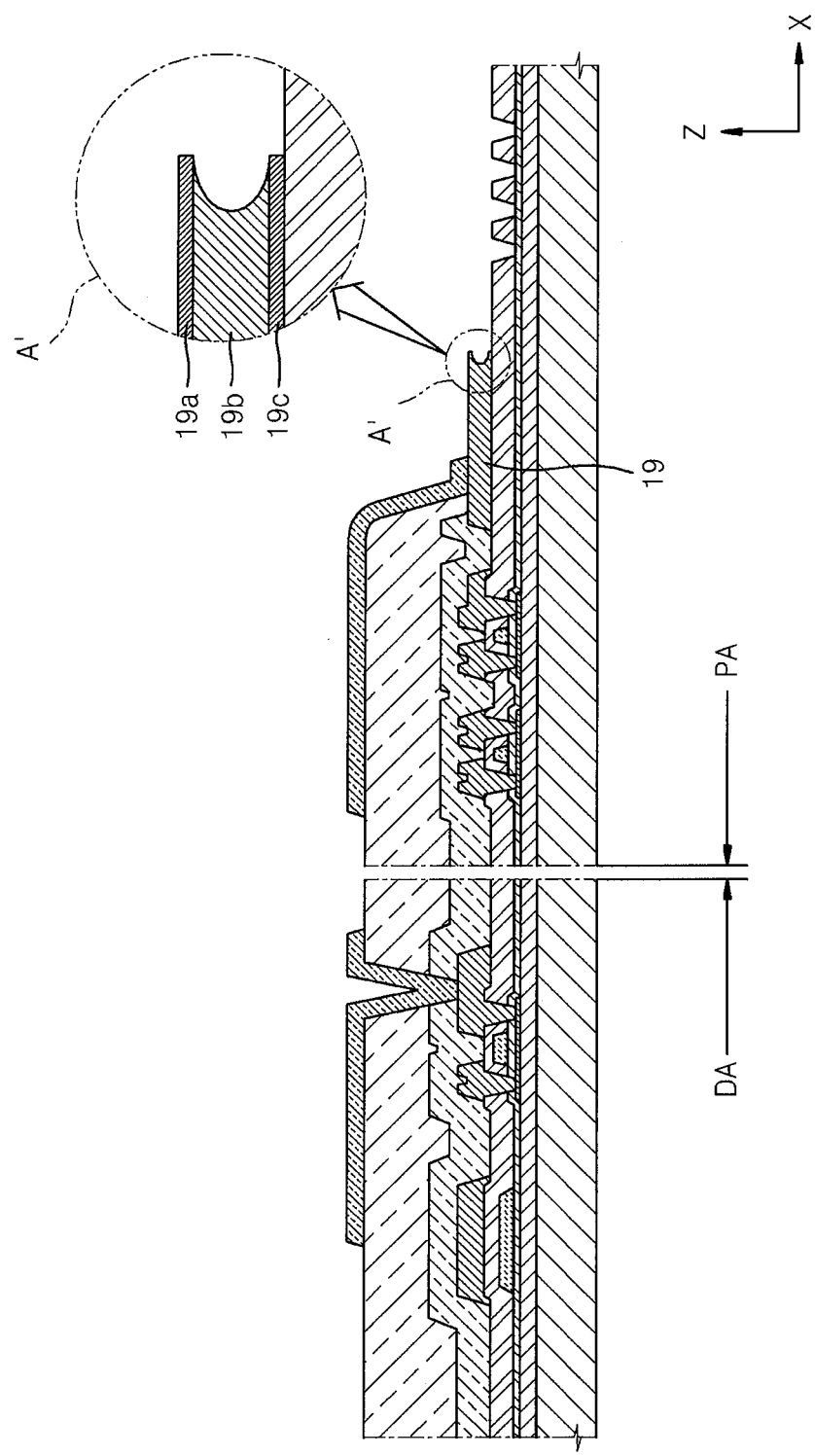
FIGS. 2 and 3 are schematic cross-sectional views of a portion of an organic light-emitting display apparatus according to a comparative embodiment.
Figure 3:
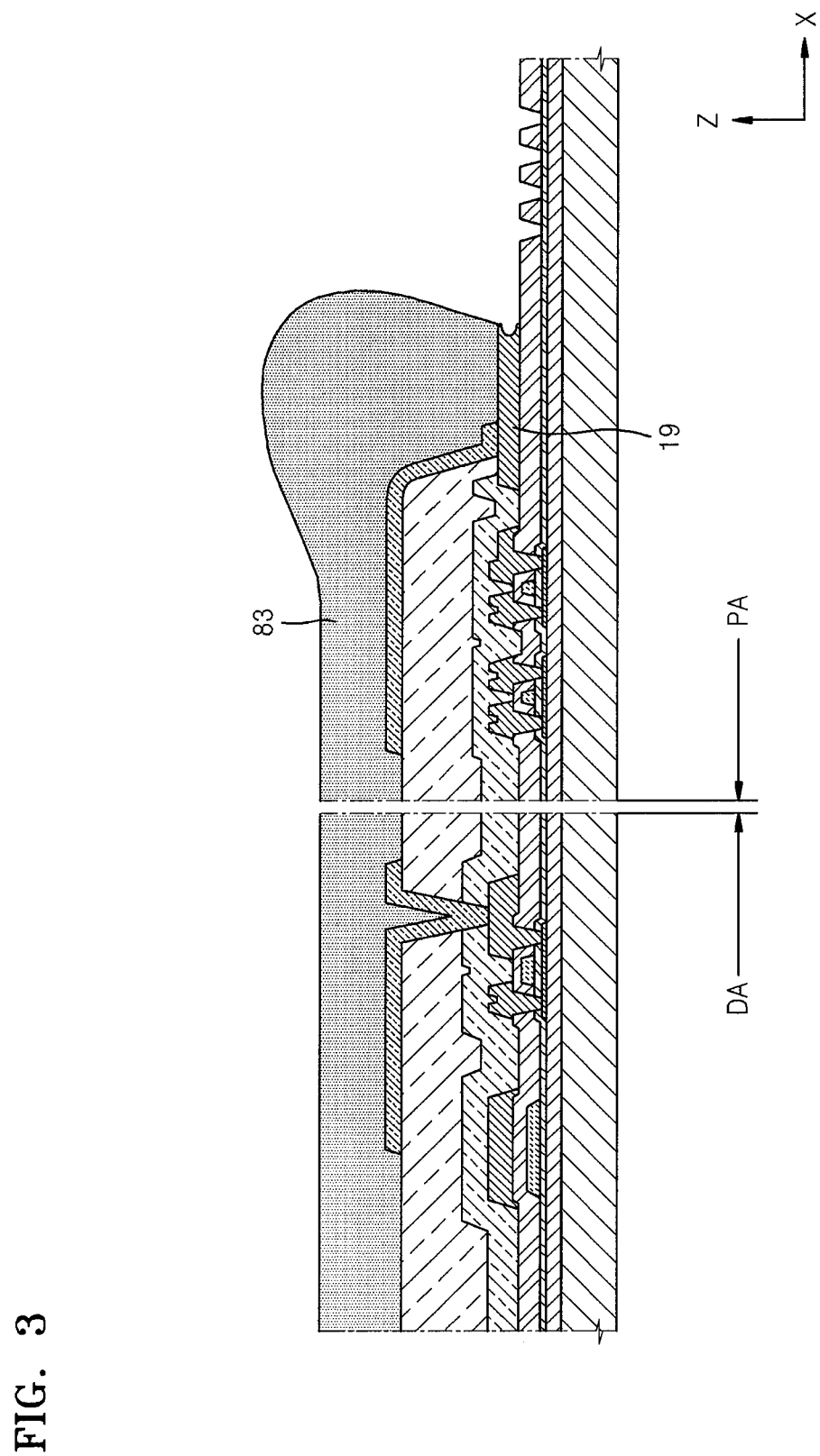

FIGS. 2 and 3 are schematic cross-sectional views of a portion of an organic light-emitting display apparatus according to a comparative embodiment. As shown in FIG. 2, the electrode power supply line 19 includes a first Ti layer 19*c*, an Al layer 19*b* on the first Ti layer 19*c*, and a second Ti layer 19*a* on the Al layer 19*b*. The etch rate of the Al layer 19*b* is higher than that of the second Ti layer 19*a*.

Here, if there is no opening (e.g., groove or hole) formed in an interlayer insulation layer as shown in FIG. 2, and an end side surface of one end portion of the electrode power supply line 19 is not covered by the interlayer insulation layer and is exposed to the outside, the Al layer 19*b* may be etched more than the second Ti layer 19*a* during the formation of the electrode power supply line 19 or other operations. Since the top surface of the Al layer 19*b* is covered by the second Ti layer 19*a*, the top surface of the Al layer 19*b* is not damaged. However, as shown in the portion A' of FIG. 2, one end portion of the Al layer 19*b* is exposed to the outside, and thus the corresponding portion is etched. As a result, the end side surface of the one end portion of the electrode power supply line 19 has an inwardly concave shape.

After a pixel electrode is formed, a pixel defining layer having an opening for exposing the center portion of the pixel electrode is formed. To this end, as shown in FIG. 3, a material for forming the pixel defining layer, which is an organic material such as polyimide, is applied onto a planarizing layer and the pixel electrode. The material for forming the pixel defining layer is applied onto the planarizing layer and the pixel electrode by moving a nozzle for ejecting the same in a direction from the left to the right of FIG. 3 (+x direction). Here, as shown in FIGS. 2 and 3, if the end side surface of the one end portion of the electrode power supply line 19 has an inwardly concave shape, the material for forming the pixel defining layer does not spread toward an edge of the substrate (+x direction) at the end of the one end portion of the electrode power supply line 19 and is collected thereat, as shown in FIG. 3. As a result, there is a problem in forming the pixel defining layer with an uniform thickness. Furthermore, in case of concurrently (e.g., simultaneously) fabricating a plurality of organic light-emitting devices by using (utilizing) a single large-sized mother glass, the material for forming the pixel defining layer may not spread smoothly from one organic light-emitting device to another organic light-emitting device.

However, in case of an organic light-emitting display apparatus according to the present embodiment, the distance d1 between the top surface of the substrate 110 and the top surface of the one end portion of the electrode power supply line 191, the portion toward an edge of the substrate 110 (+x direction), becomes smaller than or equal to the distance d2 between the top surface of the substrate 110 and the top surface of the interlayer insulation layer 160. Therefore, as shown in FIG. 1, an end side surface of one end portion of the electrode power supply line 191 is covered by the interlayer insulation layer 160, and thus the end side surface of the one end portion of the electrode power supply line 191 may not be exposed to the outside or may have a reduced exposure (e.g., to be exposed to the minimum). As a result, damages to the end side surface of the one end portion of the electrode power supply line 191 may be prevented or reduced (e.g., minimized), and thus the material for forming the pixel defining layer may be applied onto the display area DA and the peripheral area PA to a uniform thickness.

Figure 4:
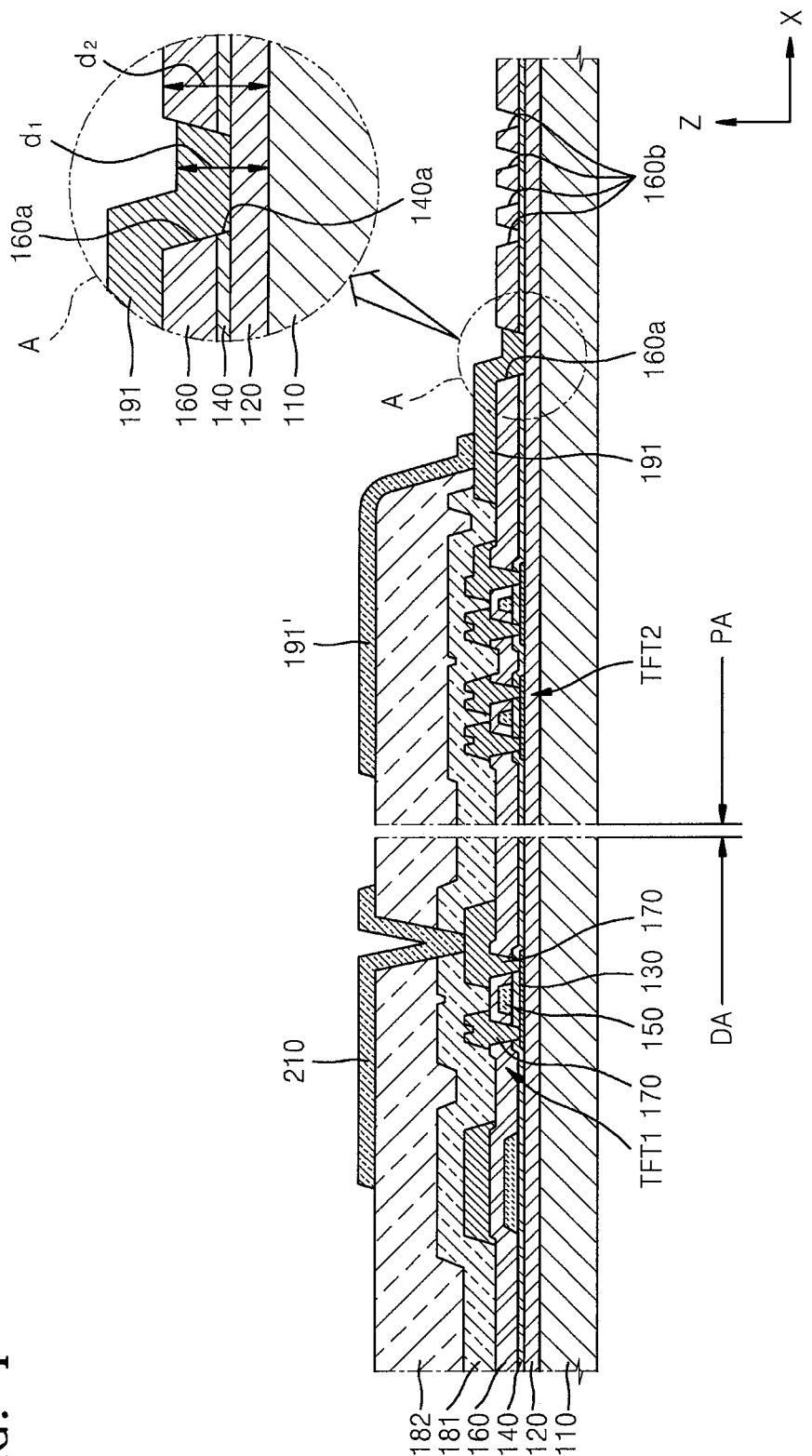
FIG. 4 is a schematic sectional view of a portion of an organic light-emitting display apparatus according to another embodiment of the present invention.

FIG. 4 is a schematic sectional view of a portion of an organic light-emitting display apparatus according to another embodiment of the present invention. The organic light-emitting display apparatus according to the present embodiment is located across (or over) the display area DA and the peripheral area PA of the substrate 110, and includes the gate insulation layer 140 interposed between the substrate 110 and the interlayer insulation layer 160, where the gate insulation layer 140 has a second opening (e.g., a second groove or second hole) 140*a* corresponding to the first opening 160*a* of the interlayer insulation layer 160. The second opening 140*a* of the gate insulation layer 140 may be concurrently (e.g., simultaneously) formed as the first opening 160*a* of the interlayer insulation layer 160, and thus the inner surface of the second opening 140*a* of the gate insulation layer 140 and the inner surface of the first opening 160*a* of the interlayer insulation layer 160 may form a continuous surface.

The one end portion of the electrode power supply line 191, the portion toward an edge of the substrate 110 (+x direction), is located in the first opening 160*a* of the interlayer insulation layer 160 and the second opening 140*a* of the gate insulation layer 140. Therefore, as shown in the portion A of FIG. 4, the distance d1 between the top surface of the substrate 110 and the top surface of the one end portion of the electrode power supply line 191, the portion toward an edge of the substrate 110 (+x direction), may become smaller than or equal to the distance d2 between the top surface of the substrate 110 and the top surface of the interlayer insulation layer 160. To this end, a sum of the thickness of the interlayer insulation layer 160 and the thickness of the gate insulation layer 140 may be greater than the thickness of the electrode power supply line 191. If the thickness of the electrode power supply line 191 is identical or similar to the thickness of the interlayer insulation layer 160, the one end portion of the electrode power supply line 191, the portion toward an edge of the substrate 110 (+x direction), is located in (e.g., inside) the first opening 160a of the interlayer insulation layer 160, as shown in FIG. 4.

As described above, as the distance d1 between the top surface of the substrate 110 and the top surface of the one end portion of the electrode power supply line 191, the portion toward an edge of the substrate 110 (+x direction), becomes smaller than or equal to the distance d2 between the top surface of the substrate 110 and the top surface of the interlayer insulation layer 160, the end side surface of the one end portion of the electrode power supply line 191 may not be exposed to the outside or may have a reduced exposure (e.g., to be exposed to the minimum). As a result, damages to the end side surface of the one end portion of the electrode power supply line 191 may be prevented or reduced (e.g., minimized), and thus the material for forming the pixel defining layer may be applied onto the display area DA and the peripheral area PA to a uniform thickness.

Furthermore, an opening (e.g., a groove or a hole) corresponding to the second opening 140a may be formed in the buffer layer 120 below the gate insulation layer 140, so that the one end portion of the electrode power supply line 191, the portion toward an edge of the substrate 110 (+x direction), may be located in (e.g., inside) the first opening 160a, the second opening 140a, and the opening of the buffer layer 120.

Figure 5:
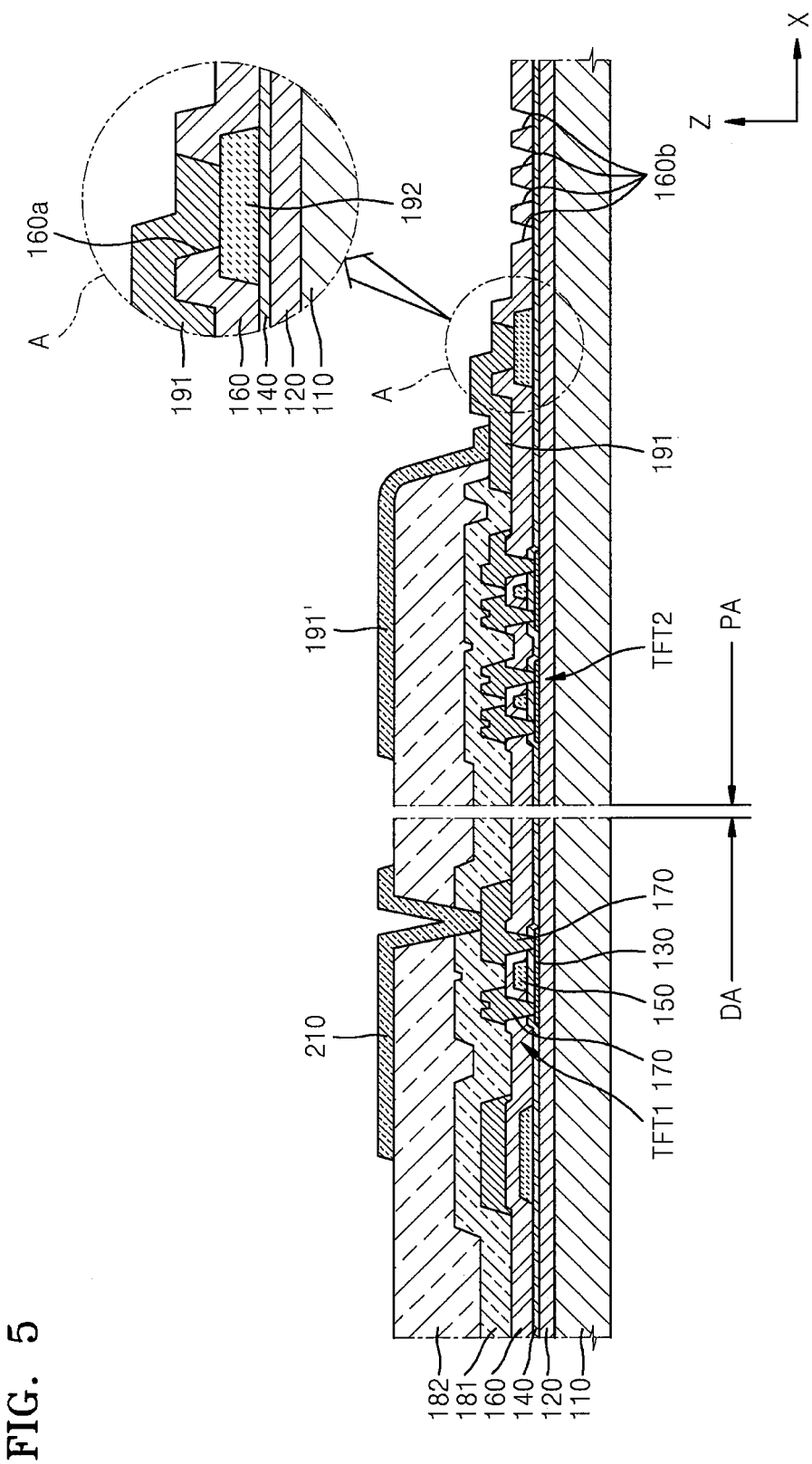
FIG. 5 is a schematic sectional view of a portion of an organic light-emitting display apparatus according to another embodiment of the present invention.

FIG. 5 is a schematic sectional view of a portion of an organic light-emitting display apparatus according to another embodiment of the present invention. The organic light-emitting display apparatus according to the present embodiment is identical to the organic light-emitting display apparatus of FIG. 1 except that the organic light-emitting display apparatus according to the present embodiment further includes a stopper layer 192. The stopper layer 192 is interposed between the substrate 110 and the interlayer insulation layer 160, and is at least partially exposed by the first opening 160a of the interlayer insulation layer 160. Furthermore, the one end portion of the electrode power supply line 191 contacts the stopper layer 192.

When the first opening 160a is formed by etching a particular portion of the interlayer insulation layer 160, a layer therebelow may also be etched unintentionally. Therefore, to reduce or prevent such an unintentional etching, the stopper layer 192 may be located below the portion of the interlayer insulation layer 160 at which the first opening 160a is to be formed. As a result, only the interlayer insulation layer 160 may be etched for precise formation of the first opening 160a. The stopper layer 192 may be concurrently (e.g., simultaneously) formed of the same material as the gate electrode 150 of the thin-film transistors TFT1 and TFT2. In other words, the stopper layer 192 may be a conductive layer.

In this case, as described above, the end side surface of the one end portion of the electrode power supply line 191 may be covered by the interlayer insulation layer 160, such that the end side surface of the one end portion of the electrode power supply line 191 is not exposed to the outside or has a reduced exposure (e.g., is exposed to the minimum).

Figure 6:
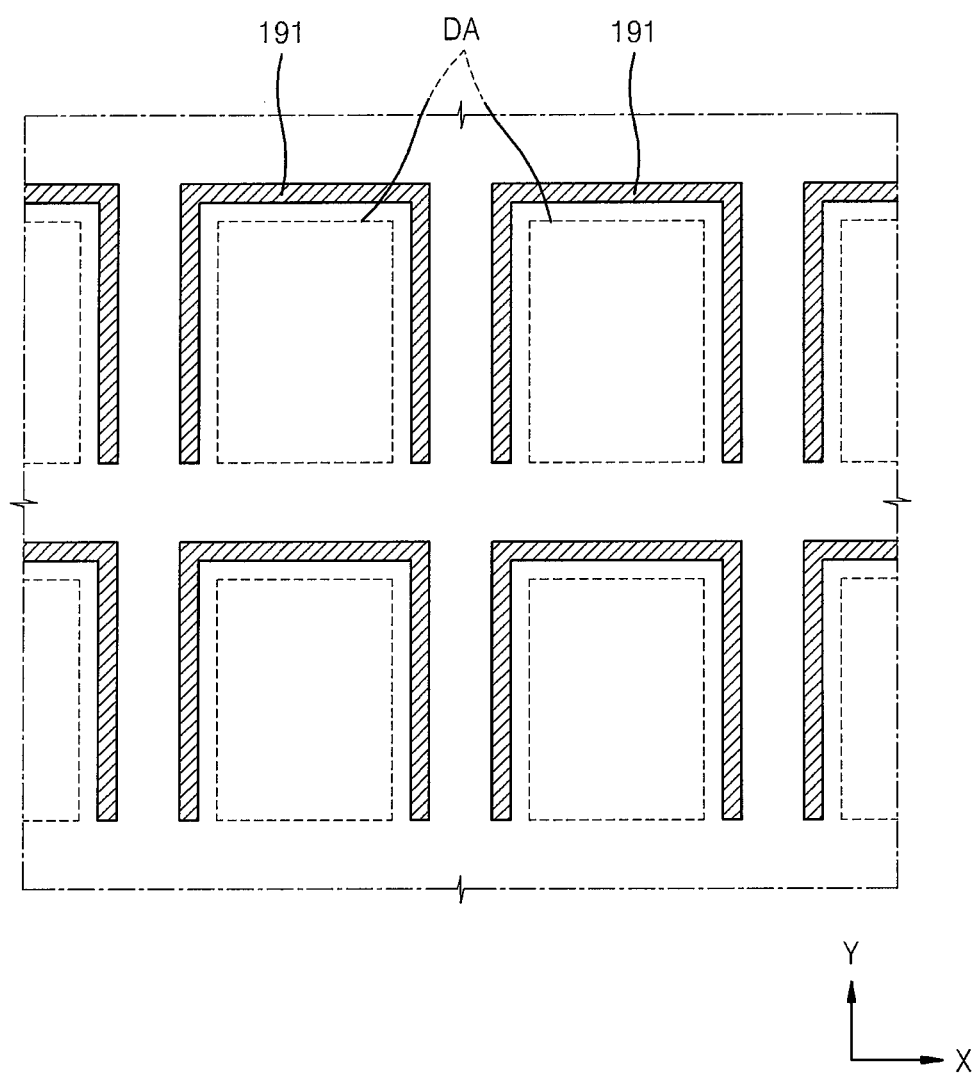
FIG. 6 is a schematic plan view showing an operation during the manufacturing of an organic light-emitting display apparatus according to another embodiment of the present invention.

FIG. 6 is a schematic plan view showing an operation during the manufacturing of an organic light-emitting display apparatus according to another embodiment of the present invention. As shown in FIG. 6, a plurality of organic light-emitting devices may be concurrently (e.g., simultaneously) manufactured by forming a plurality of display areas DA on a single large-sized mother glass. Here, the electrode power supply line 191 having a shape surrounding three out of four sides of the display area DA may be located around each of the plurality of display areas DA. Therefore, the first opening 160a of the interlayer insulation layer 160 and/or the second opening 140a of the gate insulation layer 140 may also have shapes extending along three out of four sides of the display area DA like (similar to) the electrode power supply line 191.

In terms of a completed organic light-emitting display apparatus, the first opening 160a of the interlayer insulation layer 160 and/or the second opening 140a of the gate insulation layer 140 may have shapes extending along an edge side of the substrate 110. If desired, the electrode power supply line 191 may also have a shape extending along an edge side of the substrate 110.

Meanwhile, as shown in FIG. 6, when each of the display areas DA has a rectangular shape including long sides and short sides and a material for forming the pixel defining layer is applied onto the mother glass for forming the pixel defining layer, the material for forming the pixel defining layer may be applied onto a planarizing layer and an interlayer insulation layer by moving a nozzle for ejecting the material for forming the pixel defining layer in a direction from the left to the right (+x direction) in FIG. 6. Here, to smoothly apply the material for forming the pixel defining layer from a first display area DA to a second display area DA adjacent to the first display area DA to the right in the +x direction, it is desired to reduce or prevent flow of the material for forming the pixel defining layer from being interrupted by the electrode power supply lines 191 located between the first display area DA and the second display area DA.

Therefore, the first opening 160a of the interlayer insulation layer 160 and/or the second opening 140a of the gate insulation layer 140 may have shapes extending along a long side of the display area DA. If desired, the electrode power supply line 191 may also have a shape extending along a long side of the display area DA. Here, since a completed organic light-emitting display apparatus has a rectangular shape including long sides and short sides, a long side of the display area DA may be understood as a long side of the substrate 110.

When applying the material for forming the pixel defining layer onto the mother glass for forming the pixel defining layer, it may be considered to apply the material for forming the pixel defining layer onto the planarizing layer and the interlayer insulation layer by moving the nozzle for ejecting the material for forming the pixel defining layer in a vertical direction (y-axis direction) instead of the direction from the left to the right (+x direction). However, in terms of increasing the number of display areas DA formed on a single mother glass for improving usability of the mother glass, it may be desired to move the nozzle for ejecting the material for forming the pixel defining layer in the direction from the left to the right of FIG. 6 (+x direction). In this case, by employing the structure as described above, defects may be prevented or effectively reduced during formation of the pixel defining layer.

Figure 7:
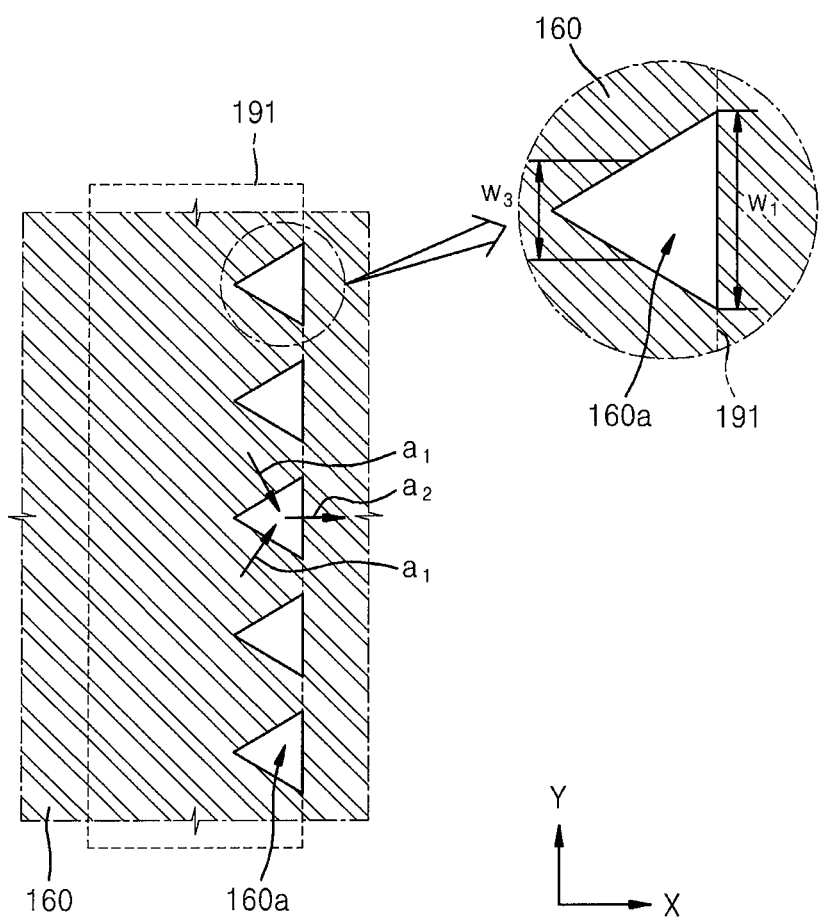
FIG. 7 is a schematic plan view showing an operation during the manufacturing of an organic light-emitting display apparatus according to another embodiment of the present invention.

FIG. 7 is a schematic plan view showing an operation during the manufacturing of an organic light-emitting display apparatus according to another embodiment of the present invention. As shown in FIG. 7, the first opening 160a of the interlayer insulation layer 160 and/or the second opening 140a of the gate insulation layer 140 may be formed at a plurality of locations along an edge side of the substrate (in terms of a completed organic light-emitting display apparatus). In this case, the electrode power supply line 191 may have a shape extending along the edge side of the substrate. Here, the edge side may be the long side from among the long sides and short sides of the substrate.

In this case, the top surface of a portion of the electrode power supply line 191 located on the interlayer insulation layer 160 becomes higher than the top surface of the portion of the electrode power supply line located inside the first opening 160a of the interlayer insulation layer 160. Therefore, the material for forming the pixel defining layer applied onto the electrode power supply line 191 may naturally flow from the top surface of the portion of the electrode power supply line 191 located on the interlayer insulation layer to the top surface of the portion of the electrode power supply line 191 located in the first opening 160a of the interlayer insulation layer 160 (refer to arrow $a_1$).

Next, since the end side surface of the electrode power supply line 191 extending in the +x direction is covered by the interlayer insulation layer 160, a portion of the material for forming an insulation layer (e.g., the pixel defining layer) on the top surface of the portion of the electrode power supply line 191 located in the first opening 160a of the interlayer insulation layer 160 may naturally flow from the electrode power supply line 191 onto the interlayer insulation layer 160 in the +x direction (refer to the arrow $a_2$). Therefore, the material for forming the pixel defining layer may be smoothly applied onto the electrode power supply line 191 and the interlayer insulation layer 160.

Meanwhile, as shown in FIG. 7, when one end portion of the first opening 160a of the first insulation layer 160 toward an edge of the substrate 110 (+x direction) is referred to as a first portion, one end portion of the first opening 160a of the first insulation layer 160 toward the display area DA of the substrate 110 (−x direction) is referred to as a second portion, and a portion between the first portion and the second portion is referred to as a third portion, the width $w_1$ of the first portion in (along) a direction in which an edge side of the substrate 110 extends (−y direction) may be greater than the width $w_3$ of the third portion in (along) the direction in which an edge side of the substrate 110 extends (−y direction).

Therefore, in case of applying the material for forming the pixel defining layer onto a mother glass to form the pixel defining layer, the material for forming the pixel defining layer may flow smoothly from the electrode power supply line 191 onto the interlayer insulation layer 160 in the +x direction via the first portion of the first opening 160a having the width $w_1$ that is relatively greater than the width $w_3$ by applying the material for forming the pixel defining layer onto the electrode power supply line 191 and the interlayer insulation layer 160 by moving a nozzle ejecting the material for forming the pixel defining layer in a direction from the left to the right (+x direction) in FIG. 7 (refer to the arrow $a_2$).

The shape of the first opening 160a of the interlayer insulation layer 160 is not limited to a shape having a triangular orthographic projection image with respect to the substrate 110 as shown in FIG. 7. For example, as shown in FIG. 8, which is a schematic plan view showing an operation during the manufacturing of an organic light-emitting display apparatus according to another embodiment of the present invention, the first opening 160a of the interlayer insulation layer 160 may have a trapezoidal shape.

In this case, when one end portion of the first opening 160a of the interlayer insulation layer 160 toward an edge of the substrate 110 (+x direction) is referred to as a first portion, one end portion of the first opening 160a of the interlayer insulation layer 160 toward the display area DA of the substrate 110 (−x direction) is referred to as a second portion, and a portion between the first portion and the second portion is referred to as a third portion, the width $w_1$ of the first portion in a direction in which an edge side of the substrate 110 extends (−y direction) may be greater than the width $w_3$ of the third portion in the direction in which an edge side of the substrate 110 extends (−y direction).

Furthermore, the width $w_3$ of the third portion in the direction in which an edge of the substrate 110 extends (−y direction) may be greater than the width $w_2$ of the second portion in the direction in which an edge of the substrate 110 extends (−y direction).

Figure 8:
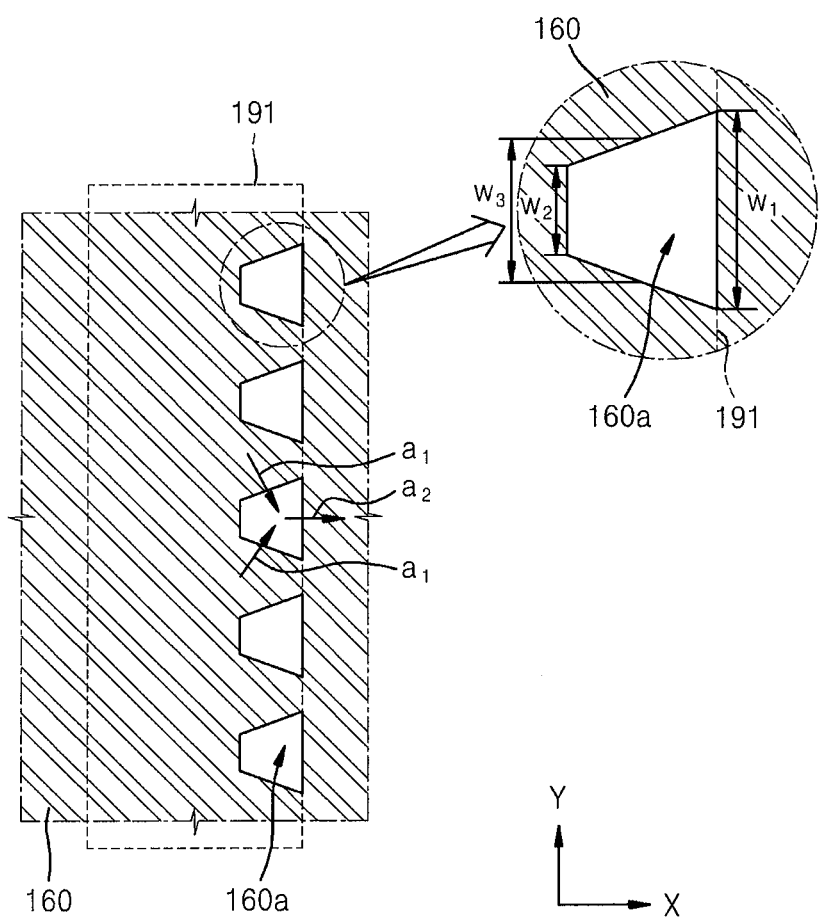
FIG. 8 is a schematic plan view showing an operation during the manufacturing of an organic light-emitting display apparatus according to another embodiment of the present invention.

Therefore, in case of applying the material for forming the pixel defining layer onto a mother glass to form the pixel defining layer, smooth flow of the material for forming the pixel defining layer from the top surface of a portion of the electrode power supply line 191 located on the interlayer insulation layer 160 onto the top surface of a portion of the electrode power supply line 191 located in the first opening 160a having the width $w_3$ that is greater than the width $w_2$ may be induced by applying the material for forming the pixel defining layer onto the electrode power supply line and the interlayer insulation layer by moving a nozzle ejecting the material for forming the pixel defining layer in a direction from the left to the right (+x direction) in FIG. 8 (refer to the arrow $a_2$).

Figure 9:
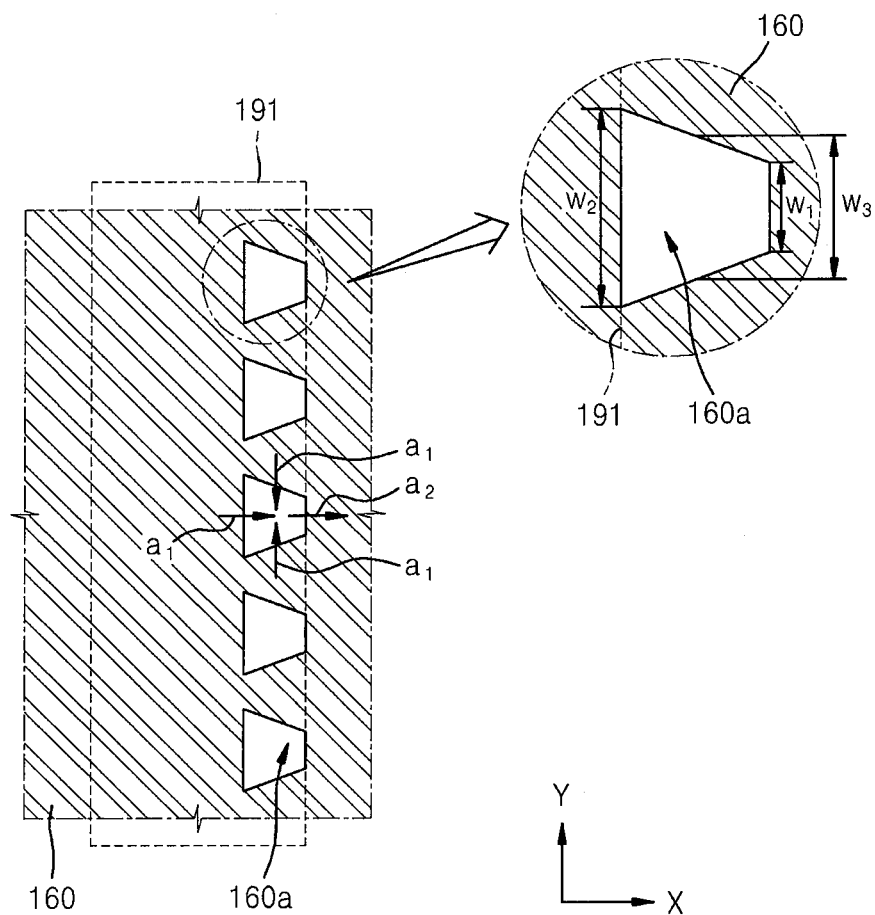
FIG. 9 is a schematic plan view showing an operation during the manufacturing of an organic light-emitting display apparatus according to another embodiment of the present invention.

If desired, as shown in FIG. 9, which is a schematic plan view showing an operation during the manufacturing of an organic light-emitting display apparatus according to another embodiment of the present invention, the first opening 160a having a shape opposite to that of the first opening 160a as shown in FIG. 8 around the y-axis may be considered. However, in terms of smooth flow of a material for forming a pixel defining layer, the first opening 160a may have the shape as shown in FIG. 8.

Figure 10:
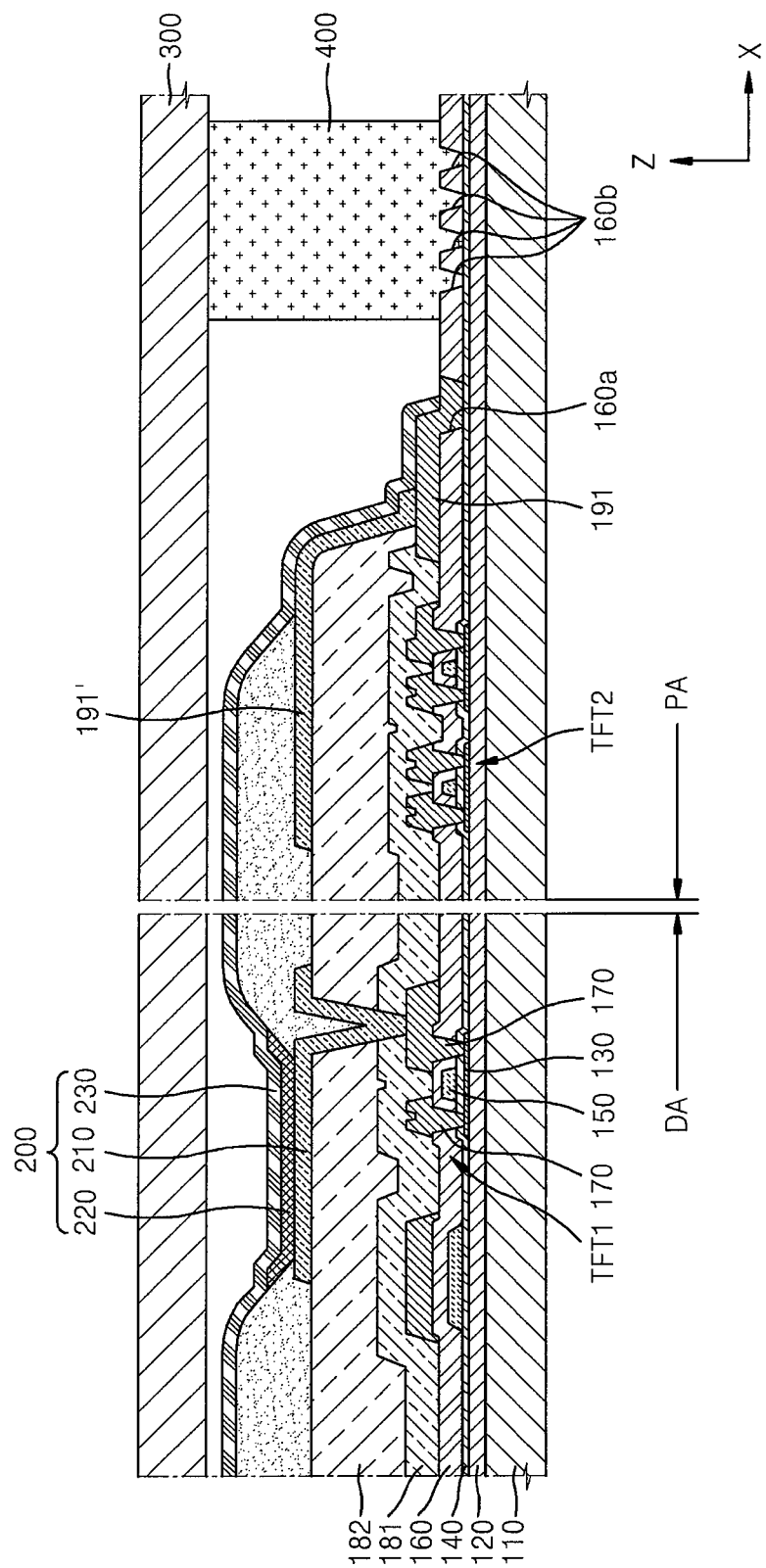
FIG. 10 is a schematic sectional view of an organic light emitting display apparatus according to another embodiment of the present invention.
Figure 11:
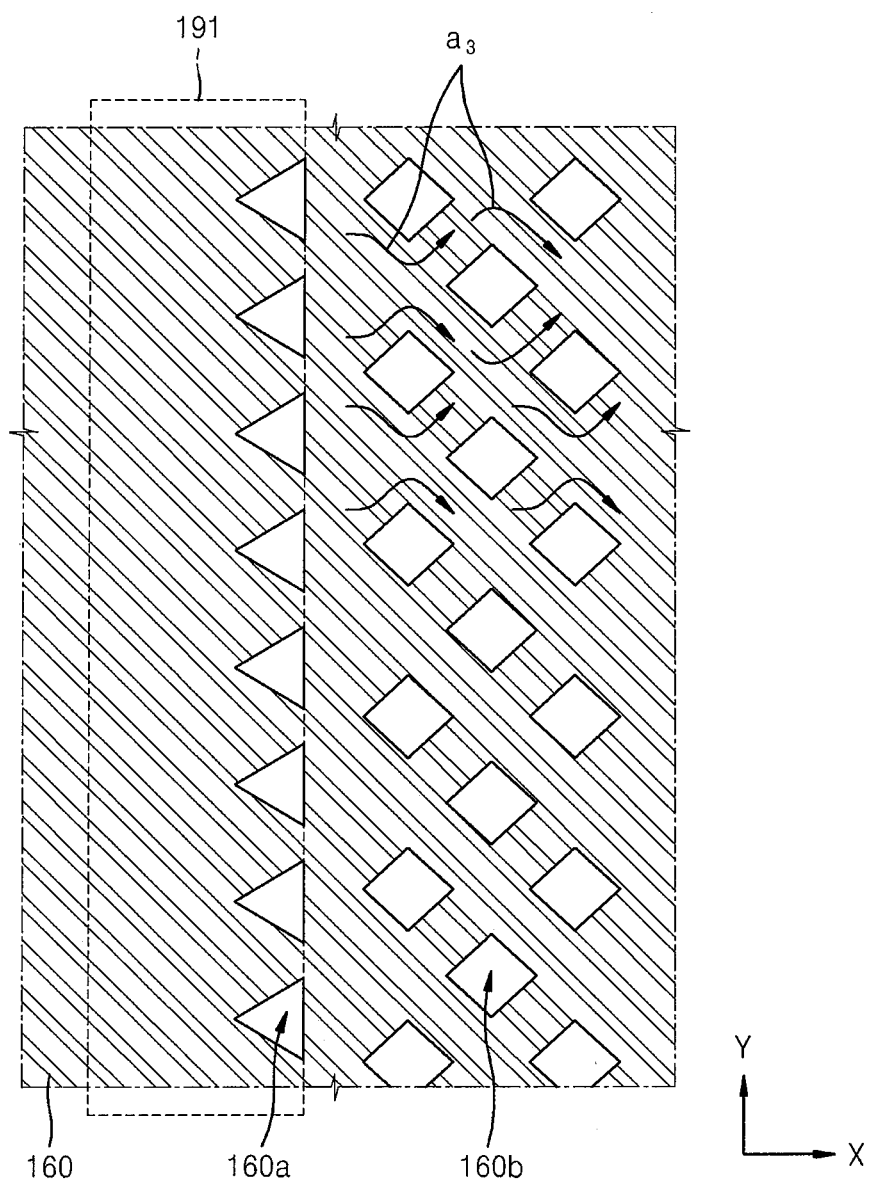
FIG. 11 is a schematic plan view showing an operation during the manufacturing of an organic light-emitting display apparatus of FIG. 10.

FIG. 10 is a schematic sectional view of an organic light emitting display apparatus according to another embodiment of the present invention, and FIG. 11 is a schematic plan view showing an operation during the manufacturing of an organic light-emitting display apparatus of FIG. 10.

As shown in FIGS. 10 and 11, a counter substrate 300 is arranged to face the substrate 110, such that the interlayer insulation layer 160, the electrode power supply line 191, and the organic light-emitting device 200 are arranged inside (or covered by) the counter substrate 300. Furthermore, the counter substrate 300 and the substrate 110 are adhered to each other via a sealing unit 400. Here, the interlayer insulation layer 160 on the substrate 110 includes a third opening (e.g., a third groove or third hole) 160b between the first opening 160a and an edge of the substrate 110, where the sealing unit 400 fills the third opening 160b. Therefore, adhesiveness between the sealing unit 400 and the substrate 110 may be further improved.

Here, the orthogonal projection image of the third opening 160b with respect to the substrate 110 is a polygonal shape, where an end of the orthogonal projection image of the third opening 160b toward the display area DA (−x direction) may be acute (i.e., a projection with an acute angle).

If a material for forming the pixel defining layer is applied onto the electrode power supply line 191 and the interlayer insulation layer 160 by moving a nozzle ejecting the material for forming the pixel defining layer in a direction from the left to the right (−x direction) in FIG. 11, and an end of the orthogonal projection image of the third opening 160b toward the display area DA (−x direction) is not acute and has a side extending in the −y direction, for example, flow of the material for forming the pixel defining layer may be interrupted by the side and the material for forming the pixel defining layer may not flow smoothly. However, in case of an organic light-emitting display apparatus according to the present embodiment, the orthogonal projection image of the third opening 160b with respect to the substrate 110 is a polygonal shape and an end of the orthogonal projection image of the third opening 160b in a direction toward the display area DA (−x direction) is acute, and thus the material for forming the pixel defining layer may naturally flow in the +x direction.

Although organic light-emitting display apparatuses according to embodiments of the present invention have been described above by using terms including the interlayer insulation layer 160, the gate insulation layer 140, the electrode power supply line 191, and the stopper layer 192, the present invention is not limited thereto. For example, the interlayer insulation layer 160 may be referred to as a first insulation layer, the gate insulation layer 140 may be referred to as a second insulation layer interposed between the first insulation layer and the substrate 110, the electrode power supply line 191 may be referred to as a first conductive layer that is located on the first insulation layer and has one end portion located in a first opening of the first insulation layer, and the stopper layer 192 may be referred to as a second conductive layer interposed between the substrate 110 and the first insulation layer.

Meanwhile, although figures show only the case where the interlayer insulation layer 160 has the hole 160a penetrating the interlayer insulation layer 160, the hole 160a in the interlayer insulation layer 160 shown in the figures may be changed to a groove which does not penetrate the interlayer insulation layer 160.

As described above, according to one or more of the above embodiments of the present invention, an organic light-emitting display apparatus having a structure capable of reducing defects during the formation of an insulation layer may be embodied. However, the scope of the present invention is not limited thereto.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
a substrate having a display area and a peripheral area surrounding the display area;
a first insulation layer on the substrate and over the display area and the peripheral area, the first insulation layer comprising a first groove or first hole at the peripheral area; and
a first conductive layer on the first insulation layer and having one end portion in the first groove or first hole,
wherein a distance between a top surface of the substrate and a top surface of the one end portion of the first conductive layer is smaller than or equal to a distance between the top surface of the substrate and a top surface of the first insulation layer, the one end portion of the first conductive layer being a portion of the first conductive layer toward an edge of the substrate.

2. The organic light-emitting display apparatus of claim 1, wherein the first conductive layer has a multi-layer structure, and
an etch rate of a material constituting a layer below a topmost layer is higher than an etch rate of a material constituting the topmost layer.

3. The organic light-emitting display apparatus of claim 1, wherein the first conductive layer comprises a first Ti layer, an Al layer on the first Ti layer, and a second Ti layer on the Al layer.

4. The organic light-emitting display apparatus of claim 1, wherein the distance between the top surface of the substrate and the top surface of the one end portion of the first conductive layer is identical to the distance between the top surface of the substrate and the top surface of the first insulation layer.

5. The organic light-emitting display apparatus of claim 1, wherein the top surface of the one end portion of the first conductive layer and the top surface of the first insulation layer form a continuous surface.

6. The organic light-emitting display apparatus of claim 5, wherein a thickness of the first conductive layer is identical to a thickness of the first insulation layer.

7. The organic light-emitting display apparatus of claim 1, further comprising a second insulation layer between the substrate and the first insulation layer and over the display area and the peripheral area, the second insulation layer having a second groove or second hole corresponding to the first groove or first hole,
wherein the one end portion of the first conductive layer is in the first groove or first hole of the first insulation layer and the second groove or second hole of the second insulation layer, and
the distance between the top surface of the substrate and the top surface of the one end portion of the first conductive layer is smaller than or equal to the distance between the top surface of the substrate and the top surface of the first insulation layer.

8. The organic light-emitting display apparatus of claim 7, wherein a sum of a thickness of the first insulation layer and a thickness of the second insulation layer is greater than a thickness of the first conductive layer.

9. The organic light-emitting display apparatus of claim 1, further comprising a stopper layer between the substrate and the first insulation layer and at least partially exposed by the first groove or first hole of the first insulation layer, wherein the one end portion of the first conductive layer contacts the stopper layer.

10. The organic light-emitting display apparatus of claim 9, wherein the stopper layer is a second conductive layer.

11. The organic light-emitting display apparatus of claim 1, wherein the first groove or first hole of the first insulation layer has a shape extending along an edge side of the substrate, and
the first conductive layer has a shape extending along the edge side of the substrate.

12. The organic light-emitting display apparatus of claim 1, wherein the substrate has a rectangular shape having long sides and short sides, and
an edge side of the substrate is the long side.

13. The organic light-emitting display apparatus of claim 1, wherein the first insulation layer comprises a plurality of first grooves or first holes formed at a plurality of locations along an edge side of the substrate, the first grooves or first holes comprising the first groove or first hole, and the first conductive layer has a shape extending along the edge side of the substrate.

14. The organic light-emitting display apparatus of claim 13, wherein the substrate has a rectangular shape having long sides and short sides, and the edge side of the substrate is the long side.

15. The organic light-emitting display apparatus of claim 13, wherein, when one end portion of the first groove or first hole of the first insulation layer toward an edge of the substrate is referred to as a first portion, one end portion of the first groove or first hole of the first insulation layer toward the display area of the substrate is referred to as a second portion, and a portion between the first portion and the second portion is referred to as a third portion, a width of the first portion along a direction in which the edge side of the substrate extends is greater than a width of the third portion along the direction in which the edge side of the substrate extends.

16. The organic light-emitting display apparatus of claim 15, wherein the width of the third portion along the direction in which the edge side of the substrate extends is greater than the width of the second portion along the direction in which the edge side of the substrate extends.

17. The organic light-emitting display apparatus of claim 1, wherein the first insulation layer comprises a third groove or third hole between the first groove or first hole and the edge of the substrate, an orthogonal projection image of the third groove or third hole with respect to the substrate has a polygonal shape, and an end of the orthogonal projection image of the third groove or third hole in a direction toward the display area is acute.

18. The organic light-emitting display apparatus of claim 17, further comprising:

a counter substrate facing the substrate, wherein the first insulation layer and the first conductive layer are located between the counter substrate and the substrate; and a sealing unit adhering the substrate with the counter substrate, wherein the sealing unit fills the third groove or third hole.

* * * * *